(12) United States Patent
Yen et al.

(10) Patent No.: US 10,924,833 B2
(45) Date of Patent: Feb. 16, 2021

(54) MICROPHONE AND TERMINAL DEVICE

(71) Applicant: Beijing Xiaomi Mobile Software Co., Ltd., Beijing (CN)

(72) Inventors: Chiafu Yen, Beijing (CN); Hui Du, Beijing (CN)

(73) Assignee: Beijing Xiaomi Mobile Software Co., Ltd., Beijing (CN)

( * ) Notice: Subject to any disclaimer, the term of this patent is extended or adjusted under 35 U.S.C. 154(b) by 0 days.

(21) Appl. No.: 16/584,252

(22) Filed: Sep. 26, 2019

(65) Prior Publication Data
US 2020/0107092 A1   Apr. 2, 2020

(30) Foreign Application Priority Data

Sep. 27, 2018   (CN) .......................... 201811132764.0

(51) Int. Cl.
*H04R 1/04* (2006.01)
*H04R 1/28* (2006.01)
*H04R 7/04* (2006.01)

(52) U.S. Cl.
CPC ............. *H04R 1/04* (2013.01); *H04R 1/2807* (2013.01); *H04R 7/045* (2013.01)

(58) Field of Classification Search
CPC combination set(s) only.
See application file for complete search history.

(56) References Cited

U.S. PATENT DOCUMENTS

| | | | |
|---|---|---|---|
| 2009/0079054 A1 | 3/2009 | Asai | |
| 2010/0202649 A1* | 8/2010 | Inoda | H04R 1/021 381/361 |
| 2013/0327221 A1 | 12/2013 | Roehnelt | |
| 2015/0315013 A1 | 11/2015 | Hsieh et al. | |
| 2016/0219376 A1 | 7/2016 | Wang et al. | |
| 2016/0322455 A1* | 11/2016 | Woodford | H01L 29/0657 |
| 2016/0337561 A1* | 11/2016 | Park | H04N 5/2253 |
| 2017/0280218 A1 | 9/2017 | Wang et al. | |
| 2018/0362332 A1* | 12/2018 | Khenkin | H04R 19/04 |
| 2020/0186939 A1* | 6/2020 | Zou | B81B 7/0064 |
| 2020/0255284 A1* | 8/2020 | Kueffner | H04R 1/04 |

FOREIGN PATENT DOCUMENTS

| | | |
|---|---|---|
| CN | 207766455 U | 8/2018 |
| KR | 10-1346583 B1 | 1/2014 |
| WO | WO 2016/029378 A1 | 3/2016 |

OTHER PUBLICATIONS

Partial European Search Report dated Feb. 18, 2020 in European Patent Application No. 19200142.8, 12 pages.
Extended European Search Report dated May 28, 2020 in European Patent Application No. 19200142.8, 12 pages.

* cited by examiner

*Primary Examiner* — Fan S Tsang
*Assistant Examiner* — Angelica M McKinney
(74) *Attorney, Agent, or Firm* — Oblon, McClelland, Maier & Neustadt, L.L.P.

(57) ABSTRACT

The disclosure relates to a microphone and a terminal device. The microphone includes a circuit board including a sound receiving hole; a signal converter configured to convert a sound signal into an electrical signal, wherein the signal converter includes a housing that forms a cavity, and wherein the cavity is connected to the sound receiving hole; and an adhesive member disposed in the cavity.

18 Claims, 3 Drawing Sheets

MICROPHONE AND TERMINAL DEVICE

CROSS-REFERENCE TO RELATED APPLICATIONS

This application is based on and claims priority to Chinese Patent Application No. 201811132764.0, filed on Sep. 27, 2018, the entire contents of which are incorporated herein by reference.

TECHNICAL FIELD

The present disclosure relates to the field of terminal device technologies, and in particular, to a microphone and a terminal device.

BACKGROUND

A microphone is an integral part of a terminal device. A microphone may include a signal converter and a circuit board. The signal converter may include a housing which forms a cavity, and a vibrating diaphragm located in the cavity; the sound receiving hole may be disposed on the circuit board. The signal converter may be connected to the circuit board so that the vibrating diaphragm is aligned with the sound receiving hole. A sound signal may be transmitted to the cavity through the sound receiving hole to drive the vibrating diaphragm to vibrate, thereby causing the signal converter to convert the sound signal into an electrical signal.

However, during use, impurities from outside the microphone may enter the cavity through the sound receiving hole and stay on the vibrating diaphragm. Accumulated impurities may scratch and pierce the vibrating diaphragm as the vibrating diaphragm vibrates, thereby affecting proper function of the microphone.

SUMMARY

This Summary is provided to introduce a selection of aspects of the present disclosure in a simplified form that are further described below in the Detailed Description. This Summary is not intended to identify key features or essential features of the claimed subject matter, nor is it intended to be used to limit the scope of the claimed subject matter.

Aspects of the disclosure provide a microphone. The microphone includes a circuit board including a sound receiving hole; a signal converter configured to convert a sound signal into an electrical signal, wherein the signal converter includes a housing that forms a cavity, and wherein the cavity is connected to the sound receiving hole; and an adhesive member disposed in the cavity.

In an example, the adhesive member is attached to a part of the circuit board that the cavity covers.

In another example, the adhesive member extends from the cavity to the sound receiving hole.

In yet another example, the adhesive member is at least partially attached to a sidewall of the sound receiving hole.

According to another aspect, the circuit board includes a supporting member attached to a sidewall of the sound receiving hole and located in the sound receiving hole, and the adhesive member is at least partially attached to the supporting member.

According to yet another aspect, the supporting member includes a supporting table extending towards an axis of the sound receiving hole, and the supporting table is configured to support the adhesive member.

According to yet another aspect, the microphone further includes a connecting layer including two adhesive surfaces disposed oppositely, wherein the two adhesive surfaces adhere to the adhesive member and a target carrier to which the adhesive member is to be attached, respectively.

According to yet another aspect, the circuit board includes a first flexible circuit board covering the cavity, and the sound receiving hole is disposed on the first flexible circuit board.

According to yet another aspect, the microphone further includes slits disposed around the sound receiving hole on the first flexible circuit board.

According to yet another aspect, the signal converter further includes an integrated circuit, and the integrated circuit is connected to the first flexible circuit board and disposed outside the cavity, and includes a component with a ring-shaped structure.

According to yet another aspect, the circuit board includes a second flexible circuit board located outside the cavity, and the second flexible circuit board includes staggered slits provided thereon.

In an example, the staggered slits include arc-shaped ends.

In another example, the adhesive member covers a free area on the circuit board.

In yet another example, the supporting member is sleeved in the sound receiving hole.

In yet another example, the supporting member and the circuit board are integrally formed.

According to an aspect, the signal converter includes a vibrating diaphragm disposed in the cavity.

Aspects of the disclosure also provide a terminal device. The terminal device includes a microphone, which includes a circuit board including a sound receiving hole; a signal converter configured to convert a sound signal into an electrical signal, wherein the signal converter includes a housing that forms a cavity, and wherein the cavity is connected to the sound receiving hole; and an adhesive member disposed in the cavity.

It is to be understood that both the foregoing general description and the following detailed description are illustrative and explanatory only and are not restrictive of the present disclosure.

BRIEF DESCRIPTION OF DRAWINGS

The accompanying drawings, which are incorporated in and constitute a part of the specification, illustrate aspects consistent with the present disclosure and, together with the description, serve to explain the principles of the present disclosure.

The specific aspects of the present disclosure, which have been illustrated by the accompanying drawings described above, will be described in detail below. These accompanying drawings and description are not intended to limit the scope of the present disclosure in any manner, but to explain the concept of the present disclosure to those skilled in the art via referencing specific aspects.

DETAILED DESCRIPTION

Reference will now be made in detail to exemplary aspects, examples of which are illustrated in the accompanying drawings. The following description refers to the accompanying drawings in which the same numbers in different drawings represent the same or similar elements unless otherwise represented. The implementations set forth in the following description of illustrative aspects do not represent all implementations consistent with the disclosure. Instead, they are merely examples of apparatuses and methods consistent with aspects related to the disclosure as recited in the appended claims.

Figure 1:
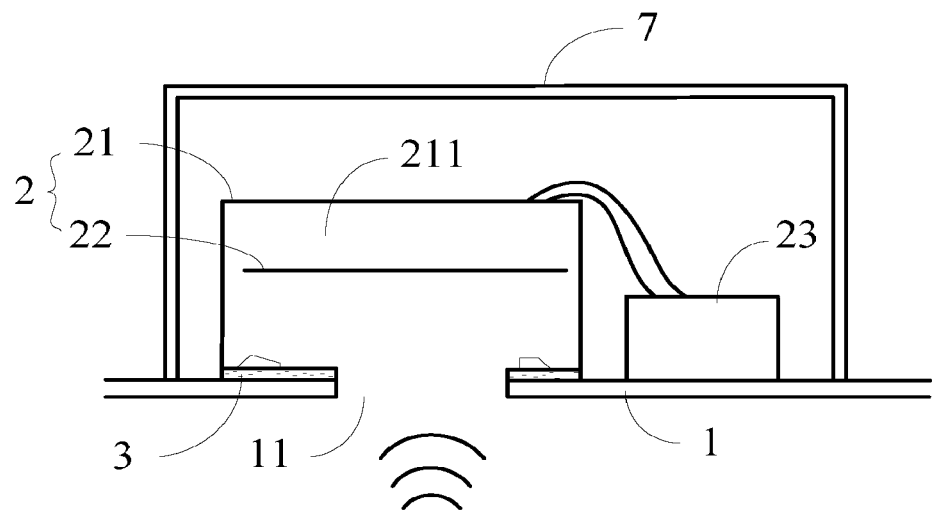
FIG. 1 is a cross-sectional view of a structure of a microphone according to an exemplary aspect of the present disclosure.

FIG. 1 is a cross-sectional view of a structure of a microphone according to an example. As shown in FIG. 1, the microphone includes a circuit board 1, a signal converter 2, and an adhesive member 3.

The circuit board 1 is formed with a sound receiving hole 11. The signal converter 2 is configured to convert a sound signal into an electrical signal and includes a housing 21 which forms a cavity 211. The signal converter 2 is attached to the circuit board 1, and the cavity 211 is connected to the sound receiving hole 11. The adhesive member 3 is disposed in the cavity 211.

In some examples, the signal converter 2 further includes a signal converting element, such as a vibrating diaphragm 22, disposed in the cavity 211. In this case, a sound wave is transmitted into the cavity 211 of the signal converter 2 through the sound receiving hole 11 in the circuit board 1, so that the vibrating diaphragm 22 disposed in the cavity 211 vibrates with the sound wave, thereby generating an electrical signal corresponding to the sound wave.

Since the adhesive member 3 is provided in the cavity 211, impurities entering the cavity 211 through the sound receiving hole 11 may be directly adhered to the adhesive member 3, so that the impurities do not contact components other than the adhesive member 3 in the cavity 211. In addition, by shaking the microphone or other similar operations, impurities in the cavity 211 may be adhered to the adhesive member 3 during motion, so that the impurities do not repeatedly contact components other than the adhesive member 3.

For a signal converting element exemplified by the vibrating diaphragm 22, by using the adhesive member 3 of the microphone provided by the examples of the present disclosure, the amount of impurities in contact with the vibrating diaphragm 22 is reduced, and the repeated contact of the impurities with the vibrating diaphragm 22 is avoided. The adhesive member 3 helps to weaken the impact and wear of impurities on the diaphragm 22, avoids damage to the diaphragm 22, and ensures proper function of the microphone, so as to extend the life of the microphone.

In some examples, the adhesive member 3 in the cavity 211 is in a sheet shape or a rod shape. In an example, the adhesive member 3 is a sheet-shaped structure. Being sheet-shaped contributes to an effective adhesion area of the adhesive member 3 to sufficiently adhere the impurities.

In an example, as shown in FIG. 1, the adhesive member 3 is attached to a part of the circuit board 1 corresponding to the cavity 211. The adhesive member 3 is attached to a part of the circuit board 1 which the cavity 211 covers. It is noted that the circuit board 1 is also provided with wiring, solder joints, etc., and the adhesive member 3 is only attached to part of the circuit board 1 where no wiring or the like is disposed, so as to not affect proper function of the circuit board 1. In this example, the impurities in the cavity 211 are adhered by the adhesive member 3 attached to the circuit board 1.

In some examples, the adhesive member 3 covers part of the circuit board 1 where no wiring, solder joints, or the like is provided, which is equivalent to an adhesive layer having a hollowed-out structure on the circuit board 1. In this way, the adhesive member 3 will be given a maximum adhesion area for maximum adhesion. Part of the circuit board 1 where no wiring, solder joints, or the like is provided is also referred to as a free area.

Figure 2:
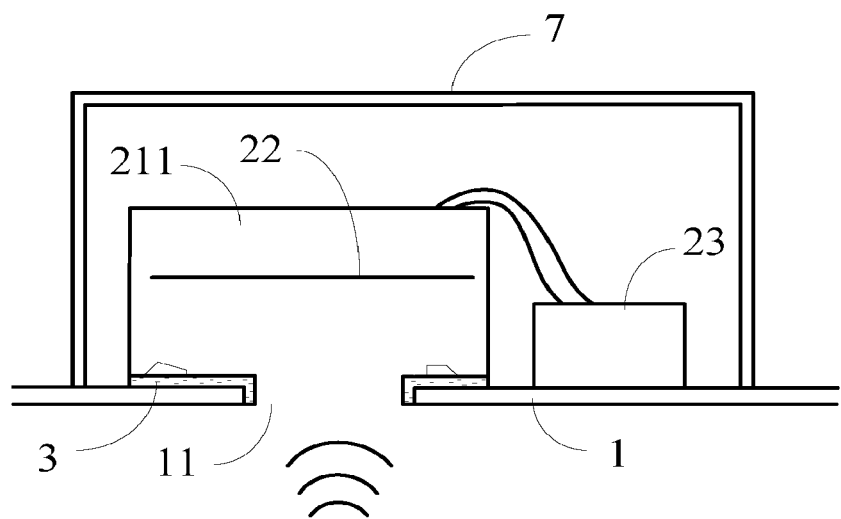
FIG. 2 is a cross-sectional view of a structure of a microphone according to an exemplary aspect of the present disclosure.
Figure 3:
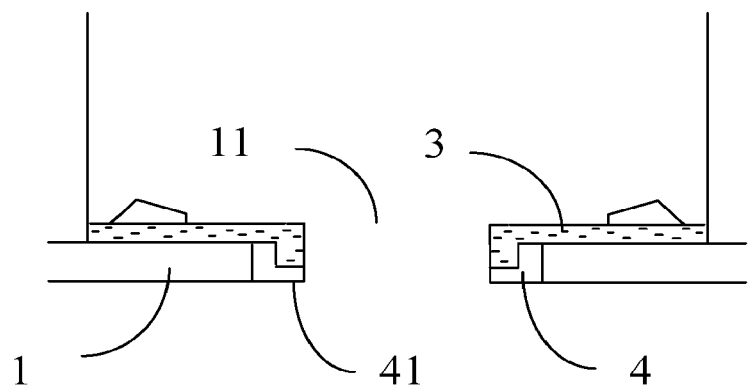
FIG. 3 is a cross-sectional view of a structure of a sound receiving hole in a microphone according to an exemplary aspect of the present disclosure.

FIG. 2 is a cross-sectional view of a structure of a microphone according to another example, and FIG. 3 is a partial cross-sectional view of a sound receiving hole in a microphone according to another example.

In an example, as shown in FIG. 2, the adhesive member 3 extends from the cavity 211 to the sound receiving hole 11. The adhesive member 3 extending to the sound receiving hole 11 prevents impurities from entering the cavity 211 through the sound receiving hole 11, thereby fundamentally reducing the amount of impurities entering the cavity 211 and preventing damage to the vibrating diaphragm 22 by impurities.

In some examples, as shown in FIG. 2, the adhesive member 3 at least partially covers a sidewall of the sound receiving hole 11. This approach eliminates the need to add additional components to further reduce the amount of impurities entering the cavity 211 and helps to control production costs.

In some examples, as shown in FIG. 3, the circuit board 1 includes at least one supporting member 4 respectively attached to a sidewall of the sound receiving hole 11 and located in the sound receiving hole 11, and the adhesive member 3 is at least partially attached to the supporting member 4. The supporting member 4 is able to better support the adhesive member 3, so as to prevent the blocking of the sound receiving hole 11 by the peeling or deformation of the adhesive member 3, thereby ensuring proper function of the microphone.

In some examples, the supporting member 4 has an annular structure and is sleeved in the sound receiving hole 11 to facilitate replacement of the adhesive member 3. The adhesive member 3 needs to be replaced after a period of usage of, for example, 24 months. By removing the supporting member 4 sleeved in the sound receiving hole 11, an end of the adhesive member 3 near the sound receiving hole 11 is detached from the supporting member 4. In this way, replacement of the adhesive member 3 becomes easier. In an example, the supporting member 4 includes a supporting table 41 extending towards an axis of the sound receiving hole 11. The supporting tables 41 increases a contact area for the adhesive member 3, ensuring that the adhesive member 3 is stably attached along the sidewall of the sound receiving hole 11. The number and the installation position of the supporting tables 41 are not specifically limited. For example, as shown in FIG. 3, two supporting tables 41 may be respectively disposed near two ends of the sound receiving hole 11 on the supporting member 4.

In some examples, to prevent the supporting member 4 from affecting sound receiving effect of the sound receiving hole 11, the size of the sound receiving hole 11 may be enlarged. In some examples, the supporting member 4 and the circuit board 1 may be integrally formed, which can stably support the adhesive member 3 and avoid adding additional components to control production cost.

Figure 4:
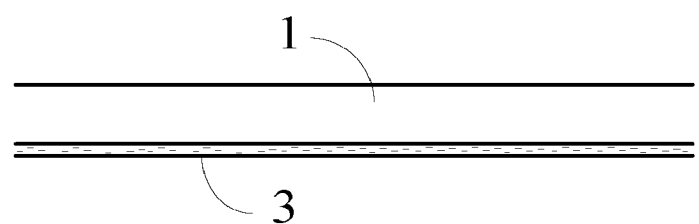
FIG. 4 is a cross-sectional view showing a joint of an adhesive member and a circuit board according to an exemplary aspect of the present disclosure.
Figure 5:
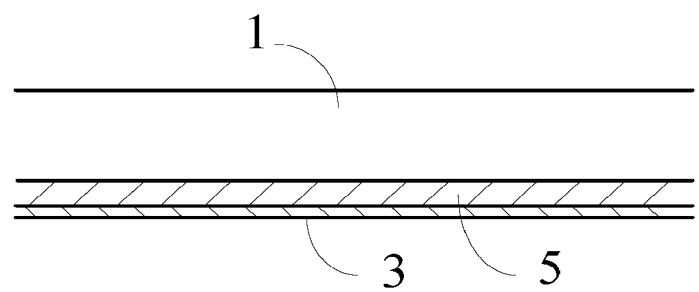
FIG. 5 is a cross-sectional view showing a joint of an adhesive member and a circuit board according to an exemplary aspect of the present disclosure.

FIG. 4 is a cross-sectional view showing a joint of an adhesive member and a circuit board according to an example; FIG. 5 is a cross-sectional view showing a joint of an adhesive member and a circuit board according to another example.

In an example, as shown in FIG. 4, the adhesive member 3 is directly attached to a target carrier. When the adhesive member 3 is stably bonded to the target carrier, the adhesive member 3 can be directly attached to the target carrier to simplify processing. The target carrier is the circuit board 1 and/or the support member 4, and FIG. 4 only takes the circuit board 1 is taken as example.

In another example, as shown in FIG. 5, the microphone further includes a connecting layer 5. The connecting layer 5 includes two adhesive surfaces disposed oppositely, the adhesive surfaces adhering to the adhesive member 3 and the target carrier, respectively. In this example, the adhesive member 3 has a different adhesiveness than the connecting layer 5, so that when the adhesive member 3 cannot be stably bonded to the target carrier, a stable attachment between the adhesive member 3 and the target carrier is achieved by the connecting layer 5. In this way, the adhesive member 3 may be formed in a variety of material to achieve desired adhesion effect. The target carrier is the circuit board 1 and/or the support member 4, and FIG. 5 only takes the circuit board 1 is taken as example.

In examples of the present disclosure, the material of the adhesive member 3 is not particularly limited, and it may be a viscous gel, a highly viscous oil, or an adhesive substance.

In an example, the circuit board 1 includes a flexible circuit board. Compared with a printed circuit board, the flexible circuit board has the characteristics of high wiring density, light weight, little thickness, and good bending property. The microphone provided with the flexible circuit board can be more fittingly assembled with other components due to the good bending property of the flexible circuit board.

Figure 6:
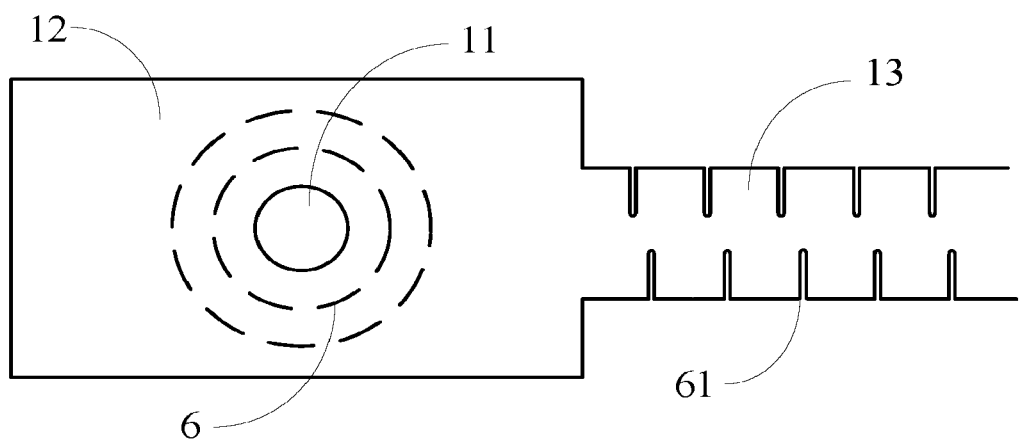
FIG. 6 is a top view of a structure of a microphone according to an exemplary aspect of the present disclosure.

FIG. 6 is a top view of a structure of a microphone according to an example. In an example, as shown in FIG. 6, the circuit board 1 includes a first flexible circuit board 12 covering the cavity 211. The first flexible circuit board 12 is provided with a sound receiving hole 11, and the sound receiving hole 11 is connected to the cavity 211. In this example, by disposing the sound receiving hole 11 on the first flexible circuit board 12, extensibility and flexibility of the first flexible circuit board 12 are improved. Illustratively, in this case, the first flexible circuit board 12 may generate protrusion defamation or depression defamation with the sound receiving hole 11 as a center. In this case, the first flexible circuit board 12 can be stably attached to a protruded or recessed component to improve the mounting stability of the microphone.

Further, as shown in FIG. 6, the first flexible circuit board 12 is provided with slits 6 distributed around the sound receiving hole 11. By disposing the slits 6 around the sound receiving hole 11, extensibility and stretchability of the first flexible circuit board 12 are further improved, making the microphone suitable for different installation requirements.

In such a case, in reference to both FIGS. 1 and 6, in some examples, the signal converter 2 includes a Micro-electro-mechanical Systems (MEMS) sensor and an integrated circuit 23. The MEMS sensor includes a housing 21 and a vibrating diaphragm 22. The integrated circuit 23 is disposed outside the cavity 211 and electrically connected to the MEMS sensor.

Further, the integrated circuit 23 is connected to the first flexible circuit board 12, and includes ring-shaped components, such as a resistor, a capacitor, and the like. Compared with a straight-line structure, the ring-shaped structure reduces length and width of the component. In addition, the components with the ring-shaped structure are disposed on a thin flexible circuit board, which helps reduce size of the integrated circuit 23 and overall installation space required by the microphone.

In an example, as shown in FIG. 6, the circuit board 1 includes a second flexible circuit board 13 disposed outside the cavity 211, and staggered slits 61 are disposed on the second flexible circuit board 13.

The second flexible circuit board 13 disposed outside the cavity 211 can connect the microphone with other components. By disposing the staggered slits 61 on the second flexible circuit board 13, flexibility of the second flexible circuit board 13 is further improved. For example, as shown in FIG. 6, the slits 61 are disposed along the width direction of the second flexible circuit board 13. This contributes to an increase in the elasticity of the second flexible circuit board 13. It can be understood that when the second flexible circuit board 13 is stretched, the slits 61 becomes wider and the second flexible circuit board 13 becomes longer. Elasticity of the second flexible circuit board 13 is improved by the slits 61, so that when the microphone moves relative to other components connected thereto, the second flexible circuit board 13 is still a continuous whole, thereby ensuring proper function of the microphone.

In some examples, the slits 6, and the slits 61 have various shapes, for example, the slits 6 and the slits 61 are rectangular, fusiform, linear, or the like. In some examples, the slits 6 and 61 have arc-shaped ends and may be shaped in an ellipse, for example. Arc-shaped ends reduce stress concentration at the ends of the slits 6 and 61, and prevent the circuit board 1 from being torn at the slits 6 and 61, thereby ensuring the safety of the terminal device.

In an example, as shown in FIGS. 1 and 2, the microphone further includes a housing 7 that houses the signal converter 2, and the housing 7 is connected to the circuit board 1. The housing 7 provides a stable working space for the signal converter 2 to ensure proper function of the microphone.

An example of the present disclosure further provides a terminal device, where the terminal device includes the above-mentioned microphone. Since the terminal device has the above-mentioned microphone, it also has the beneficial effects of the above-mentioned microphone, and details are not described herein again.

Other aspects of the present disclosure will be apparent to those skilled in the art after considering the specification and what disclosed herein. The present disclosure is intended to cover any variations, uses, or adaptations of the present disclosure, which are in accordance with the general principles of the disclosure and include common general knowledge or common technical means in the art that are not disclosed in the present disclosure. The specification and examples are to be regarded as illustrative only, and the true scope and spirit of the present disclosure are indicated by the appended claims.

It is to be understood that the disclosure is not limited to the details described and expressed in the accompanying drawings and is subject to changed and variations within its scope. The scope of the disclosure is to be limited only by the appended claims.

What is claimed is:

1. A microphone, comprising:
   a circuit board including a sound receiving hole;
   a signal converter configured to convert a sound signal into an electrical signal, wherein the signal converter includes a housing that forms a cavity, and wherein the cavity is connected to the sound receiving hole; and
   an adhesive member disposed in the cavity;
   wherein the circuit board includes a supporting member attached to a sidewall of the sound receiving hole and located in the sound receiving hole, and
   wherein the adhesive member is at least partially attached to the supporting member.

2. The microphone according to claim 1, wherein the adhesive member is attached to a part of the circuit board that the cavity covers.

3. The microphone according to claim 2, wherein the adhesive member covers a free area on the circuit board.

4. The microphone according to claim 1, wherein the adhesive member extends from the cavity to the sound receiving hole.

5. The microphone according to claim 1, wherein the adhesive member is at least partially attached to the sidewall of the sound receiving hole.

6. The microphone according to claim 1, wherein the supporting member includes a supporting table extending towards an axis of the sound receiving hole, and
   wherein the supporting table is configured to support the adhesive member.

7. The microphone according to claim 1, further comprising:
   a connecting layer including two adhesive surfaces disposed oppositely, wherein the two adhesive surfaces adhere to the adhesive member and a target carrier to which the adhesive member is to be attached, respectively.

8. The microphone according to claim 1, wherein the circuit board includes a first flexible circuit board covering the cavity, and
   wherein the sound receiving hole is disposed on the first flexible circuit board.

9. The microphone according to claim 8, further comprising:
   slits disposed around the sound receiving hole on the first flexible circuit board.

10. The microphone according to claim 8, wherein the signal converter further includes an integrated circuit, and
    wherein the integrated circuit is and disposed outside the cavity.

11. The microphone according to claim 1, wherein the supporting member is sleeved in the sound receiving hole.

12. The microphone according to claim 1, wherein the supporting member and the circuit board are integrally formed.

13. The microphone according to claim 1, wherein the signal converter includes a vibrating diaphragm disposed in the cavity.

14. A microphone comprising:
    a circuit board including a sound receiving hole;
    a signal converter configured to convert a sound signal into an electrical signal, wherein the signal converter includes a housing that forms a cavity, and wherein the cavity is connected to the sound receiving hole; and
    an adhesive member disposed in the cavity,
    wherein the circuit board includes a second flexible circuit board located outside the cavity, and
    wherein the second flexible circuit board includes staggered slits provided thereon.

15. The microphone according to claim 14, wherein the staggered slits include arc-shaped ends.

16. A terminal device, comprising a microphone,
    wherein the microphone comprises:
    a circuit board including a sound receiving hole;
    a signal converter configured to convert a sound signal into an electrical signal, wherein the signal converter includes a housing that forms a cavity, and wherein the cavity is connected to the sound receiving hole; and
    an adhesive member disposed in the cavity,
    wherein the circuit board includes a supporting member attached to a sidewall of the sound receiving hole and located in the sound receiving hole, and
    wherein the adhesive member is at least partially attached to the supporting member.

17. The terminal device according to claim 16, wherein the adhesive member is at least partially attached to the sidewall of the sound receiving hole.

18. The terminal device according to claim 16, wherein the adhesive member extends from the cavity to the sound receiving hole.

* * * * *